US006460160B1

(12) United States Patent
Classon

(10) Patent No.: US 6,460,160 B1
(45) Date of Patent: Oct. 1, 2002

(54) CHASE ITERATION PROCESSING FOR DECODING INPUT DATA

(75) Inventor: Brian Keith Classon, Streamwood, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/503,761

(22) Filed: Feb. 14, 2000

(51) Int. Cl.[7] .............................................. H03M 13/00
(52) U.S. Cl. ........................................................ 714/791
(58) Field of Search ................................ 714/751–752, 714/780, 782, 790–791

(56) References Cited

U.S. PATENT DOCUMENTS 6,134,694 A * 10/2000 Uebayashi et al. ......... 714/751

OTHER PUBLICATIONS

Kuomoto et al., A sufficient condition for ruling out some useless test error patterns in iterative decoding algorithms, IEICE Trans., p. 321–326, Feb. 1998.*
Fragiacomo et al., Novel near maximum likelihood soft decision decoding algorithm for linear block codes, IEEE, p. 265–270, Oct. 1999.*
Kasami et al., Sufficient conditions for ruling–out useless iterative steps in a class of iterative decoding algorithms, IEICE Trans., p. 2061–2073, Oct. 1999.*
Fishler et al. Geometrical and performance analysis of GMD and Chase decoding Algorithms, IEEE, p. 1406–1422, Jul. 1999.*
Nilsson, Diffenence between two soft–decision decoding algorithms, IEEE, 1665–1666, Sep. 1994.*
Forney, Jr. et al., Generalized minimum–distance decoding of Euclidean–space codes and Lattices, IEEE, p. 1992–2026, Nov. 1996.*
S. Lin and D. Costello, *Error Control Coding: Fundamentals and Applications.* Englewood Cliffs, New Jersey: Prentice Hall, 1983.
R. J. McEliece, *Finite Fields for Computer Scientists and Engineers,* Boston, MA: Kluwer, 1987.
C.–L. Chen, "Formulas for the Solutions of Quadratic Equations over GF($2^m$)," *IEEE Trans. Inform. Theory,* vol. IT–28, pp. 792–794, Sep. 1982.

(List continued on next page.)

*Primary Examiner*—Albert Decady
*Assistant Examiner*—Shelly A Chase
(74) *Attorney, Agent, or Firm*—Kenneth A. Haas

(57) ABSTRACT

System includes decoder. Decoder performs a portion of an intermediate Chase iteration, of a series of Chase iterations for decoding input data, to obtain a successful hard-decision decoding result for input data. Decoder determines that the successful hard-decision decoding result comprises overall Chase decoding result, for the series of Chase iterations, with employment of reliability information for at least one location of input data and without employment of information that specifies, for input data, error location within input data. The intermediate Chase iteration and a Chase iteration comprise consecutive Chase iterations having only one value difference between respective code patterns thereof. Decoder skips at least one intermediate Chase iteration to proceed to the intermediate Chase iteration that obtains the successful hard-decision decoding result.

34 Claims, 4 Drawing Sheets

OTHER PUBLICATIONS

A.J. van Zanten, "Index System and Separability of Constant Weight Gray Codes," *IEEE Trans. Inform. Theory,* vol. IT–37, pp. 1229–1233, Jul. 1991.

D.E. Knuth, *The Art of Computer Programming,* Reading. MA: Addison Wesley, 1973, vol., 3, pp. 207–219.

D. Gazelle and J. Snyders, "Reliability–Based Code–Search Algorithms for Maximum–Likelihood Decoding of Block Codes," *IEEE Trans. Inform. Theory,* vol. IT–43, pp. 239–249, Jan. 1997.

E.R. Berlekamp, Algebraic Coding Theory, Laguna Hills, CA: Aegean Park Press, 1984, pp. 426–428.

G.C. Clark, Jr. and J. Bibb Cain, "Error–Correction Coding for Digital Communications", Plenum Press, NY and London, 1981, pp. 167–172.

"An Improvement of Soft–Decision Maximum–Likelihood Decoding Algorithm Using Hard–Decision Bounded–Distance Decoding"; T. Kaneko, T. Nishijima, S. Hirasawa; IEEE Transactions on Information Theory, vol. 43, No. 4, Jul. 1997, p. 1314–1319.

"An Efficient Maximum–Likelihood Decoding Algorithm for Linear Block Codes with Algebraic Decoder"; T. Kaneko, T. Nishijima, H. Inazumi, & S. Hirasawa; IEEE Transactions on Information Theory, vol. 40, No. 2, Mar. 1994, p. 320–327.

"A Class of Algorithm for Decoding Block Codes with Channel Measurement Information"; David Chase, IEEE Transactions on Information Theory, vol. IT–18, No. 1, Jan. 1972; p. 170–182.

* cited by examiner

| BINARY<br>404 | GRAY CODED<br>402 |
|---|---|
| 0000 | 0000 |
| 0001 | 0001 |
| 0010 | 0011 |
| 0011 | 0010 |
| 0100 | 0110 |
| 0101 | 0111 |
| 0110 | 0101 |
| 0111 | 0100 |
| 1000 | 1100 |
| 1001 | 1101 |
| 1010 | 1111 |
| 1011 | 1110 |
| 1100 | 1010 |
| 1101 | 1011 |
| 1110 | 1001 |
| 1111 | 1000 |

CHASE ITERATION PROCESSING FOR DECODING INPUT DATA

FIELD OF THE INVENTION

The present invention relates generally to communication systems and more particularly to error control in decoding.

BACKGROUND OF THE INVENTION

Error control in communication systems provides a number of benefits. As part of error control, it is desirable to provide soft information to a decoder for use in making decisions. This soft information often takes the form of a vector a of non-negative soft-values indicating the reliability, or likelihood of correctness, of the received bits in a hard-detected vector r. Typically, a soft-decision decoder performs an estimate of the transmitted codeword on the basis of both r and a, as will be understood by those skilled in the art.

Soft-decision decoding of block codes can employ various techniques. For example, such techniques can employ trellis-based algorithms, syndrome-based algorithms, or Chase-based algorithms.

Trellis-based algorithms rely on an assumption that every linear block code can be represented by, and therefore decoded on, a trellis. An efficient decoding algorithm based on a trellis requires a "good" trellis representation, that is, one having a relatively small number of states, vertices, and/or edges. Disadvantageously, such a trellis representation may be unknown or difficult to discover for a particular code.

As another shortcoming, trellis decoding of block codes disadvantageously requires storage of the entire time-varying trellis structure, when, for most time-invariant convolutional codes, only a single section of the trellis structure is needed. Further, the amount of memory required for this extra storage can undesirably increase exponentially with code size.

As another example, a syndrome-based algorithm is employed in, for instance, coset-based soft-decision decoding, also referred to as "soft-syndrome decoding." Soft syndrome decoding identifies the most-likely error pattern from the coset of the received hard-detected vector. As one shortcoming, decoders that employ syndrome-based algorithms generally suffer from relatively high complexity at maximal decoding demand.

In a further example, Chase-based-algorithm decoders employ an underlying hard-decision decoder to produce several decoding choices, the best of which is selected as the Chase decoder output. The number of hard-decision decoding attempts is equal to the number of test patterns employed, where each test pattern is used to create a vector that is hard-decision decoded. With a sufficient number of test patterns, a Chase-based soft-decision decoder can provide a relatively high degree of decoding accuracy. As one shortcoming of the Chase-based soft-decision decoder, the entire number of test patterns must be employed to obtain the relatively high degree of decoding accuracy.

Different forms of the Chase decoder usually employ different techniques to select a minimum number of test patterns, for a given decoding performance. For example, a Chase-$2^L$ decoder permutes the bits of the received vector in its L least reliable positions. These $2^L$ permuted vectors are hard-decision decoded, with each decoding iteration successfully yielding a codeword, or an indication of decoding failure. The Chase-$2^L$ decoder selects the codeword having the smallest metric, where the metric is computed by comparing the received vector to the codeword, and summing the reliability values of the bit positions that are different.

Turning to FIG. 1 as an illustrative representation of a Chase-$2^L$ decoder of the prior art, Chase-$2^L$ decoder 100 can employ exemplary logic 102. Logic 102 employs conventional binary counting, for example, to identify iterations (e.g., loops) 108. The test pattern TP used at STEP 120 to permute the received vector r of input 111, is an L-bit number where each bit position of the TP is in a one-to-one correspondence with the L indices of least reliable soft values in vector a of input 111. A 1 in the TP corresponds to flipping the bit position, while a 0 leaves the bit position unchanged. The initial TP is all 0s, meaning that the received vector r at STEP 120 initially is directly hard-decision decoded. The TP on the $2^L$th iteration is all 1s, meaning that the L least reliable indices are all flipped before performance of that iteration 108 of hard-decision decoding through STEP 120.

For each successful hard-decision decoding (as determined at STEP 124), still referring to FIG. 1, STEP 160 computes a temporary metric by summing the soft values corresponding to the bits changed between the received vector and the decoded codeword, either from 1s in the TP or the error locations $\{x\}$. The notation $\text{sum}(a_{TP+\{x\}})$ at STEP 160 signifies that the indices corresponding to both 1s in the TP and an error in $\{x\}$, are not included in the sum since they do not result in an overall change between the received vector r and the decoded codeword.

Referring further to FIG. 1, STEP 162 stores the index of the smallest metric in $i_b$, and STEP 162 stores the errors found during that decoding iteration 108 in $\{\text{errors}\}$. At the end of $2^L$ iterations 108, STEP 164 declares a decoding failure if no successful decodings occurred (as indicated at STEP 166 by $i_b$ remaining at its initial value of −1). In the event of decoding success (to proceed to STEP 150), STEP 168 reconstructs the best decoded codeword from the received vector r by flipping the bits corresponding to the TP and $\{\text{errors}\}$. Any bits flipped in STEP 168 by both TP and $\{\text{errors}\}$, are effectively unchanged.

As one shortcoming of logic 102, again referring to FIG. 1, the binary counting for indexing consecutive instances of iterations 108, undesirably often requires multiple bits to change. As another shortcoming, logic 102 at maximal decoding must perform all iterations.

In another approach, test patterns are eliminated based on the distance properties of the code employed in the test patterns. In this example, error pattern EP comprises the difference between a previously decoded codeword and the received vector, FTP comprises a future test pattern (e.g., with 1s in some of the L least reliable positions and 0s elsewhere, in contrast to the L-bit implementation format of logic 102, FIG. 1), W(EP) comprises the Hamming weight (number of 1s) of EP except in the L least reliable positions, and W(EP,FTP) comprises the Hamming distance (number of different positions) between EP and FTP in the L least reliable positions. The distance between the codeword corresponding to EP and any codeword that FTP generates, is at most W(EP,FTP)+W(EP)+t where t is the maximum error-correction capability of the hard-decision decoder. Therefore, if the following Test (1) is satisfied, then the FTP cannot generate a new codeword.

$$W(EP)+W(EP,FTP)<d_{min}-t \tag{1}$$

In Test (1), $d_{min}$ comprises a minimum distance that is a property of the code of the test pattern, as will be appreciated by those skilled in the art. Eliminating an FTP that satisfies Test (1) will not incur any performance loss. Test (1) can serve to significantly reduce the number of hard-decision decodings.

As one shortcoming, Test (1) entails a non-negligible cost of implementation that is dominated by the determination whether the error pattern EP occurred in the L least reliable positions. As another shortcoming, the worst-case/maximum cost when no test patterns can be eliminated from the decoding through Test (1), is larger than before. For instance, this disadvantageously increased cost can comprise a fifty percent increase in processing load, depending on the particular hard-decision decoder.

It remains desirable to provide enhancements for error correction in decoding.

DETAILED DESCRIPTION OF THE INVENTION

Figure 1:
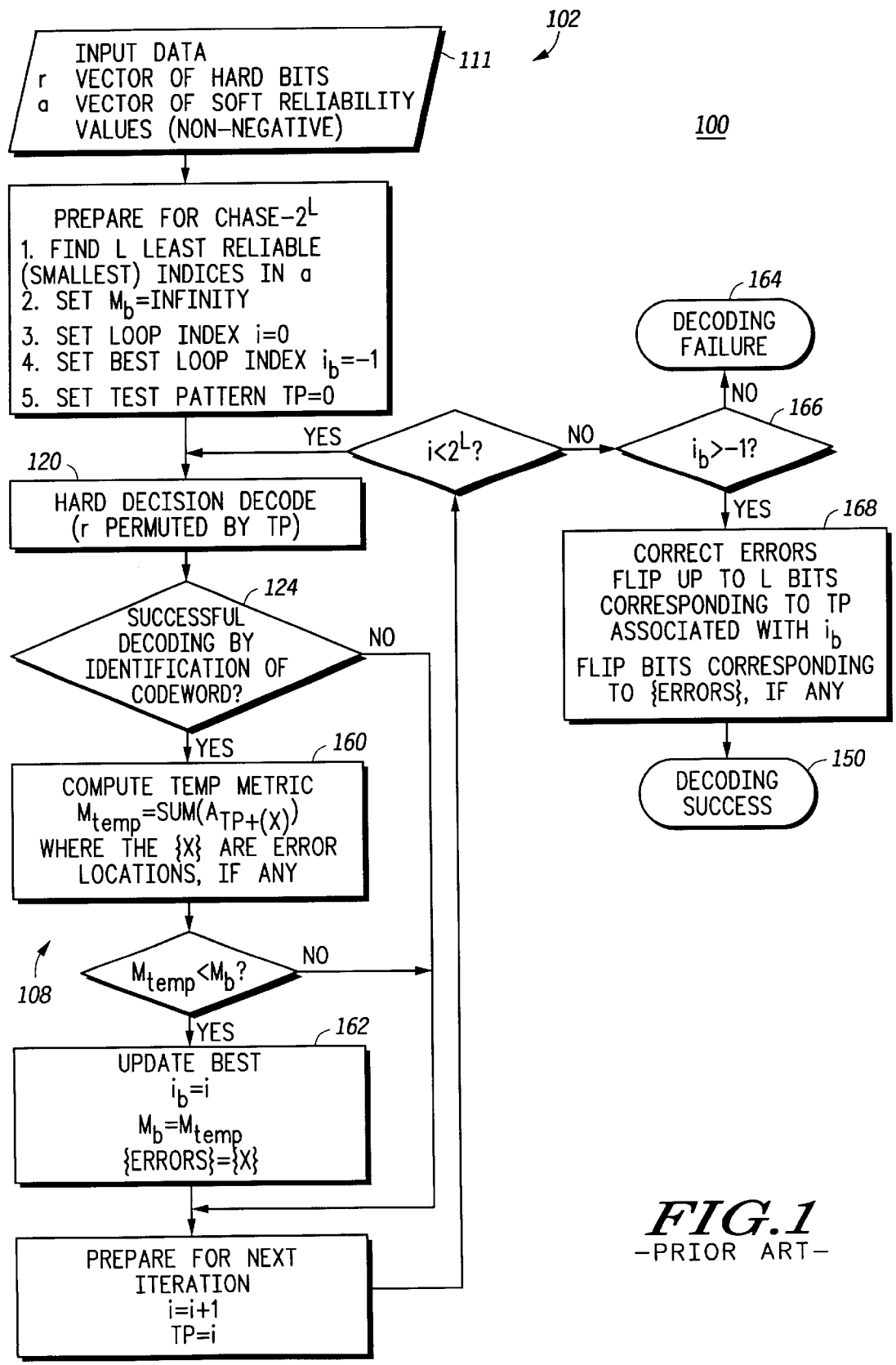
FIG. 1 represents exemplary logic of one example of a Chase decoder of the prior art, in which test patterns are indexed by conventional binary counting.

The invention in one embodiment encompasses a method for determining an overall Chase decoding result for a series of Chase iterations for decoding input data. There is performed a portion of an intermediate Chase iteration of the series of Chase iterations to obtain a successful hard-decision decoding result for the input data. There is determined that the successful hard-decision decoding result comprises the overall Chase decoding result with employment of reliability information for at least one location of the input data and without employment of information that specifies, for the input data, error location within the input data.

Another embodiment of the invention encompasses a system for determining an overall Chase decoding result for a series of Chase iterations for decoding input data. A decoder performs a portion of an intermediate Chase iteration of the series of Chase iterations to obtain a successful hard-decision decoding result for the input data. The decoder determines that the successful hard-decision decoding result comprises the overall Chase decoding result with employment of reliability information for at least one location of the input data and without employment of information that specifies, for the input data, error location within the input data.

Yet another embodiment of the invention encompasses an article of manufacture. At least one computer usable medium has computer readable program code means embodied therein for causing determination of an overall Chase decoding result for a series of Chase iterations for decoding input data. There is provided computer readable program code means for causing a computer to perform a portion of an intermediate Chase iteration of the series of Chase iterations to obtain a successful hard-decision decoding result for the input data. There is also provided computer readable program code means for causing a computer to determine that the successful hard-decision decoding result comprises the overall Chase decoding result with employment of reliability information for at least one location of the input data and without employment of information that specifies, for the input data, error location within the input data.

A further embodiment of the invention encompasses a method for performing a plurality of Chase iterations of a series of Chase iterations for decoding input data. There is employed a first code pattern to perform a first Chase iteration of the plurality of Chase iterations. There is employed a second code pattern to perform a second Chase iteration of the plurality of Chase iterations. The first and second Chase iterations comprise consecutive Chase iterations of the series of Chase iterations. Only one value difference exists between the first and second code patterns.

A still further embodiment of the invention encompasses a system for performing a plurality of Chase iterations of a series of Chase iterations for decoding input data. A decoder employs a first code pattern to perform a first Chase iteration of the plurality of Chase iterations. The decoder employs a second code pattern to perform a second Chase iteration of the plurality of Chase iterations. The first and second Chase iterations comprise consecutive Chase iterations of the series of Chase iterations. Only one value difference exists between the first and second code patterns.

Another embodiment of the invention encompasses an article of manufacture. At least one computer usable medium has computer readable program code means embodied therein for causing performance of a plurality of Chase iterations of a series of Chase iterations for decoding input data. There is provided computer readable program code means for causing a computer to employ a first code pattern to perform a first Chase iteration of the plurality of Chase iterations. There is also provided computer readable program code means for causing a computer to employ a second code pattern to perform a second Chase iteration of the plurality of Chase iterations. The first and second Chase iterations comprise consecutive Chase iterations of the series of Chase iterations. Only one value difference exists between the first and second code patterns.

Yet another embodiment of the invention encompasses a method for processing a plurality of Chase iterations of a series of Chase iterations for decoding input data. There is performed a first Chase iteration of the series of Chase iterations to obtain a successful hard-decision decoding result for the input data. There is skipped at least one intermediate Chase iteration of the series of Chase iterations to proceed to a second Chase iteration of the series of Chase iterations. The first Chase iteration and a Chase iteration of the at least one intermediate Chase iteration comprise consecutive Chase iterations, having only one value difference between respective code patterns thereof, of the series of Chase iterations. A Chase iteration of the at least one intermediate Chase iteration and the second Chase iteration comprise consecutive Chase iterations, having only one value difference between respective code patterns thereof, of the series of Chase iterations.

A further embodiment of the invention encompasses a system for processing a plurality of Chase iterations of a series of Chase iterations for decoding input data. A decoder performs a first Chase iteration of the series of Chase iterations to obtain a successful hard-decision decoding result for the input data. The decoder skips at least one intermediate Chase iteration of the series of Chase iterations to proceed to a second Chase iteration of the series Chase iterations. The first Chase iteration and a Chase iteration of the at least one intermediate Chase comprise consecutive Chase iterations, having only one value difference between respective code patterns thereof, of the series of Chase iterations. A Chase iteration of the at least one intermediate Chase iteration and the second Chase iteration comprise consecutive Chase iterations, having only one value difference between respective code patterns thereof, of the series of Chase iterations.

A still further embodiment of the invention encompasses an article of manufacture. At least computer usable medium has computer readable computer program code means embodied therein for causing processing of a plurality of Chase iterations of a series of Chase iterations for decoding input data. There is provided computer readable program code means for causing a computer to perform a first Chase iteration of the series of Chase iterations to obtain a successful hard-decision decoding result for the input data. There is also provided computer readable program code means for causing a computer to skip at least one intermediate Chase iteration of the series of Chase iterations to proceed to a second Chase iteration of the series of Chase iterations. The first Chase iteration and a Chase iteration of the at least one intermediate Chase iteration comprise consecutive Chase iterations, having only one value difference between respective code patterns thereof, of the series of Chase iterations. A Chase iteration of the at least one intermediate Chase iteration and the second Chase iteration comprise consecutive Chase iterations, having only one value difference between respective code patterns thereof, of the series of Chase iterations.

One embodiment of the invention provides an enhanced Chase decoder for error correction of block codes. The Chase decoder uses an underlying hard-decision decoder to provide enhanced soft-decision, error-correction performance. The Chase decoder, in one example, desirably reduces the average decoding complexity, relative to previous Chase decoders, by advantageously reducing the number of required hard-decision decoding attempts and/or by advantageously reducing the overhead required or employed for each hard-decision decoding attempt. In contrast to previous approaches that reduce the average decoding complexity at the cost of substantially and undesirably increasing the maximum decoding complexity, one example of the Chase decoder, advantageously does not increase the maximum decoding complexity.

Figure 5:
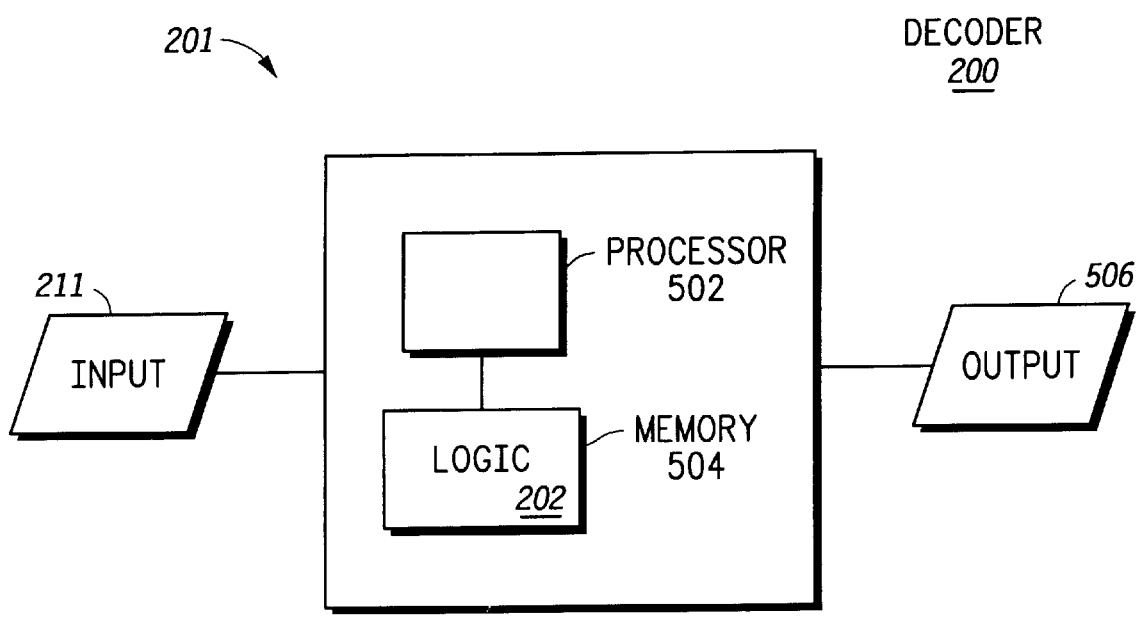
FIG. 5 represents exemplary additional details of one example of the Chase decoder of FIG. 2.

Turning to FIG. 5, system 201, in one example, comprises a receiver that employs a decoder such as Chase-$2^L$ decoder 200. One example of decoder 200 comprises (e.g., computer) processor 502 coupled with memory 504. Chase-$2^L$ decoder 200 employs, for instance, exemplary logic 202, as described herein. Memory 504, in one example, serves to store logic 202. In one example, decoder 200 receives input (e.g., data) 211 and provides output (e.g., result) 506. An illustrative description of performance of decoder 200 is presented herein, for explanatory purposes. Decoder 200 comprises, for instance, an error-correction decoder on an advanced digital signal processor that provides a number of advantageous power-saving features. For example, decoder 200 comprises a soft-output Chase decoder that serves to decode constituent block codes of a block turbo code.

Figure 2:
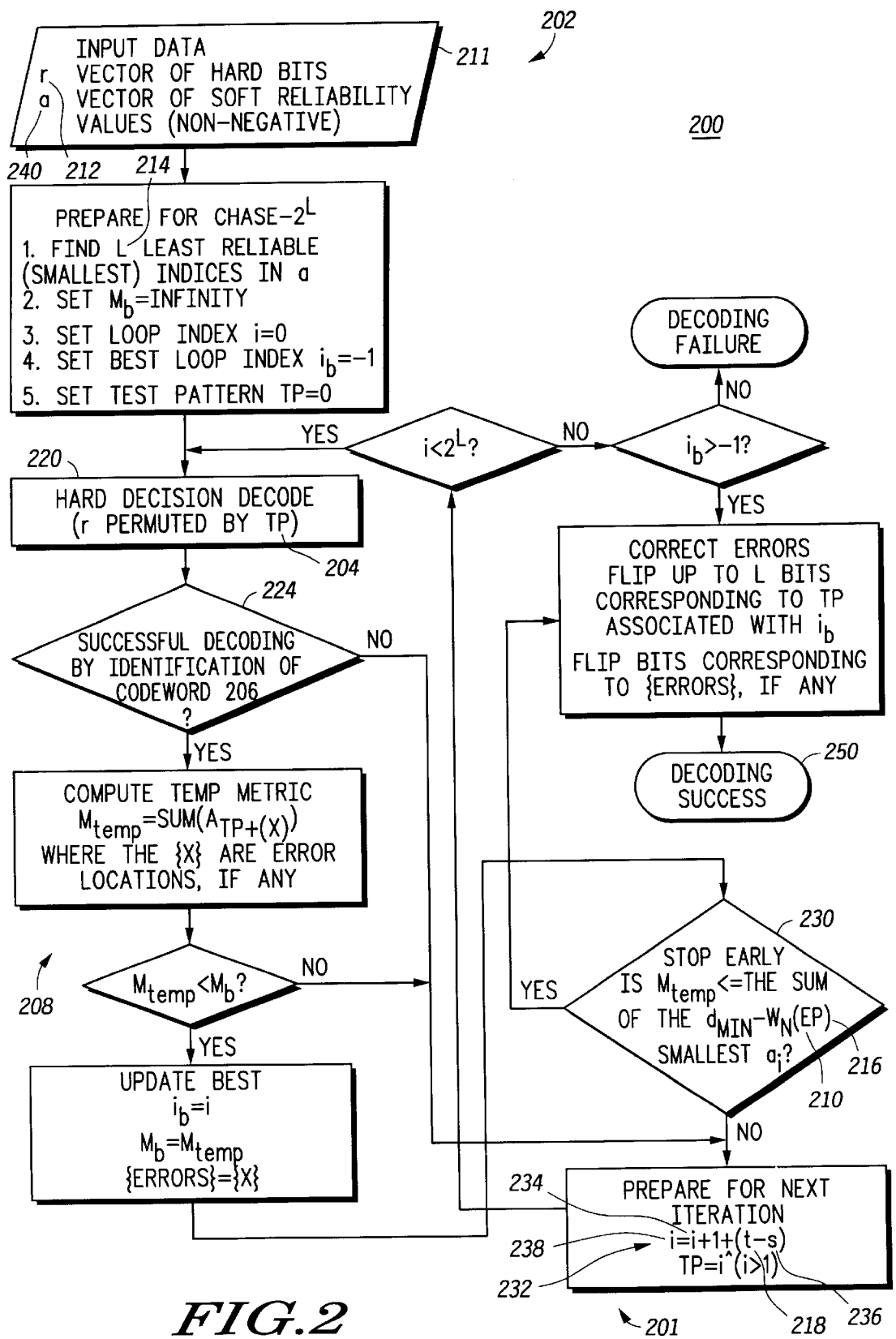
FIG. 2 represents exemplary logic employed by one example of a Chase decoder of an exemplary system, illustrating exemplary techniques of early termination, skipping of test patterns, and employment of Gray coded test patterns.

Turning to FIG. 2, Logic 202 employs a number of exemplary techniques to enhance decoding of, for instance, input data 211 such as hard-detected vector r 212 and reliability-value vector a 240 associated therewith.

As described herein, Logic 202, in one example, advantageously employs Update (3) at STEP 232 and Test (5) at STEP 230. For example, in a certain implementation of logic 202, one may consider Update (3) at STEP 232, as described herein, to comprise a technique of skipping test patterns and/or skipping ahead. In a further example, for a certain implementation of logic 202, Test (5) at STEP 232, as described herein, may be considered to comprise a technique of stopping early and/or terminating early.

Referring to FIG. 2, Logic 202 employs STEP 232, for instance, to eliminate test patterns ("TP") 204 (and iterations 208 therefor) that will not generate new codewords 206. Logic 202 employs STEP 230, for example, to determine whether decoding can be halted (and further iterations 208 avoided) subsequent to a first instance of decoding (by an initial instance of iteration 208).

As one example of a technique for enhancement of decoding, still referring to FIG. 2, STEP 232 advantageously eliminates a number of instances of test pattern 204. Since different test patterns 204 are not guaranteed to generate, and often do not generate, different (new) codewords 206 than codewords 206 from earlier or preceding iterations 208, certain test patterns 204 (and, therefore, hard-decision decodings associated therewith, at STEP 220) can be safely eliminated if, for example, STEP 232 advantageously determines that the particular test pattern(s) 204 cannot generate a new codeword 206.

In one implementation of STEP 232, referring further to FIG. 2, the key is to employ Gray-coded instances 402 (FIG. 4) of test patterns 204. As further discussed below, the use of Gray coding 402 presents a number of advantages over previous decoder approaches (e.g., that employ test patterns which comprise binary indices 404, FIG. 4). An exemplary use of Gray coding 402 is introduced by the following Theorem (2).

Theorem

If the hard-decision decoding (STEP 220) of the received vector 212 exclusive ORed with Gray coded TP 204 for index i 234, yields s 236 (out of a possible t 218) errors, then the next index 238 that generates a different codeword 206 is $i_{next}[238] \geq i[234]+1+(t[218]-s[236])$.

Proof

We need to show that for s=t−2, i+1 and i+2 cannot generate a different codeword, and for s=t−1, i+1 cannot generate a different codeword. If TP1 and TP2 are the TPs 204 for i+1 and i+2, respectively, then the Hamming distances W(TP,TP1)=1 and W(TP,TP2)=2. Also, if EP 210 is the error pattern corresponding to TP and future test pattern "FTP," W(EP,FTP)+W(EP)[Hamming weight 216]≧W(TP, FTP)+s. Applying Test (1) results in $$W(TP,FTP)+s<t+1 \leq d_{min}-t$$

Substituting TP1 for FTP proves that TP1 cannot generate a different codeword for s<t. Substituting TP2 for FTP proves that TP2 cannot generate a different codeword for s<t−1.

$$\blacklozenge \qquad (2)$$

For instance, with (31,21) BCH code for received vector r 212 and Gray coded test patterns 204 in an exemplary implementation of logic 202 (FIG. 2), Theorem (2) reduces to the following Update (3) for index i 234 based on the number of errors s 236 found in the previous iteration 208 of decoding.

$$i_{next}[238] = \begin{cases} i+3, & s=0 \\ i+2, & s=1 \\ i+1, & s=2 \end{cases} \quad (3)$$

The cost of implementing Update (3) in STEP 232 of the Gray coded system in one example of Chase-$2^L$ decoder 200, is advantageously low (e.g., negligible). Update (3), in a further example, serves to desirably reduce the average decoding complexity, advantageously without increasing the worst-case instruction count.

Figures 3, 4:
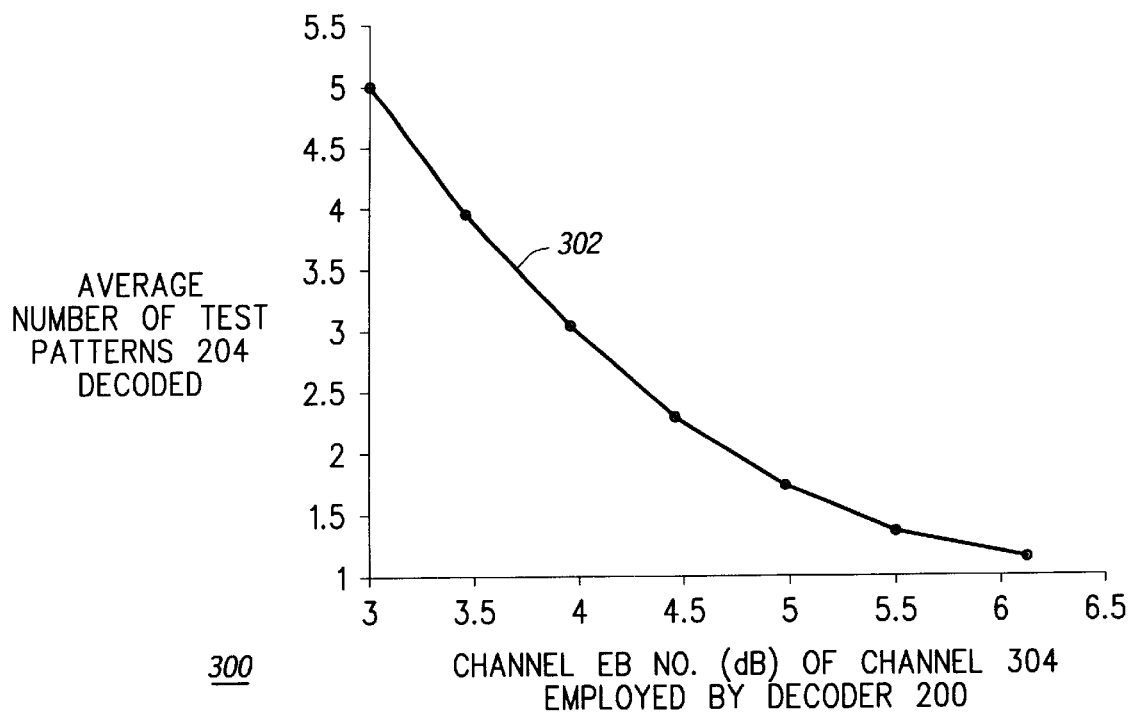
FIG. 3 represents an exemplary plot of average number of test patterns decoded versus channel signal-to-noise ratio, excluding frames with zero syndromes, for the Chase decoder of FIG. 2.
FIG. 4 illustrates one example of Gray coded test patterns, that are employed by the Chase decoder of FIG. 2, juxtaposed with a representation of the conventional binary counting of FIG. 1.

Referring now to FIGS. 2 and 4 for a discussion of another example of a technique to enhance decoding, Gray coding 402 serves to advantageously minimize the overhead associated with each Chase iteration 208. With employment of Gray coding 402 for instances of test patterns 204, the metrics employed in one example with the Chase algorithm can be differentially updated with, advantageously, only a single (e.g., value, bit) change per iteration 208. In addition, for instances of syndrome-based hard-decision decoders, the syndromes similarly can be updated differentially with, advantageously, only a single change per iteration 208.

Now referring to FIGS. 1–2 and 4, logic 102, as a representation of a previous approach, undesirably employs binary representation 404 of iteration index i as the test pattern TP for the ith instance of iteration 108, in contrast to the Gray coding 402 advantageously employed in an exemplary iteration 208 of logic 202.

In logic 102, again referring to FIGS. 1–2 and 4, a working metric (associated with the TP only) and the syndromes are updated from the original metric and syndromes, by changing 0 to L positions in each iteration 108. The average number of changes in logic 102 is L/2 per test pattern TP, and the update cost is therefore L/2 times the cost of employing Gray coded test patterns 402 in exemplary logic 202. So, for a Chase-16 (Chase-$2^4$) algorithm, the Chase-$2^L$ decoder 200 offers a 50% savings in Chase iteration overhead relative to the previous approach. In a further example, an instance of Gray coding 402 for an iteration 208 can be obtained from an instance of binary representation 404 as a count of the iteration, by employing the following exemplary Function (4).

$$i\textasciicircum(i>>1) \quad (4)$$

In Function (4), "^" represents exclusive OR and ">>" represents shift right.

Referring to FIG. 2 for a discussion of yet another example of a technique to enhance decoding, logic 202 desirably employs, for instance, STEP 230. STEP 230, in one example, provides a capability that can proceed to decoding success (STEP 250) advantageously without requiring iterations 208 for all instances of test patterns 204. For example, STEP 230 determines a decoding result for an entire series of instances of test patterns 204 (e.g., all instances of Gray coded test patterns 402 depicted in FIG. 4) when advantageously only a subset of all the test patterns 204 have been employed in decoding.

Again referring to FIG. 2, STEP 230 advantageously employs, for instance, the following Test (5) of relatively low complexity, that serves to terminate Chase-$2^L$ decoding after a successful hard-decision decoding (STEP 220), to obtain error pattern EP 210 if $$\sum_{\{EP_i=1\}} a_i \leq \sum_{\{d_{min}-W_H(EP)\text{smallest } a_i\}} a_i \quad (5)$$

As one advantage, Test (5) does not require knowledge of the error locations in the successful decoding (STEP 224). Therefore, as another advantage, Test (5) can be applied in logic 202 with desirably little (e.g., negligible) additional complexity (e.g., the implementation of a few additions and a comparison). In one example, Test (5) does not sum the best possible instances of reliability ("soft") values a 240. When Test (5) does result in termination, no performance loss in incurred. Test (5), in one example, works particularly well after the first instance of hard-decision decoding (STEP 220) with TP=0, since the Hamming weight 216 of the EP 210 is due solely to the errors found in the hard-decision decoding (STEP 220), and not from the test pattern 204, as will be appreciated by those skilled in the art.

Turning to FIG. 3, Plot 300 comprises an exemplary representation (e.g., curve) 302 for Chase-$2^L$ decoder 200 (FIG. 2), of average number of test patterns 204 decoded versus noise-to-signal ratio of channel 304 employed by the decoder 200. PLOT 300 provides simulated average complexity results for decoding (31,21) BCH code with a Chase-16 (Chase-$2^4$) implementation having Binary Phase Shift Keying ("BPSK") on Additive White Gaussian Noise ("AWGN"). Further, PLOT 300 excludes instances when the syndromes are zero, as will be appreciated by those skilled in the art.

Still referring to FIG. 3, the performance represented in PLOT 300 is advantageous for decoding. For example, PLOT 300 indicates that even though, in one example of decoder 200, the worst-case complexity is desirably not increased by Update (3) of STEP 232 (FIG. 2) and Test (5) of STEP 230 (FIG. 2), the average complexity can be advantageously reduced for most channel conditions of interest.

Referring to FIG. 2, another example of logic 202 can implement Update (3) of STEP 232 without implementing Test (5) of STEP 230, or implement Test (5) of STEP 230 without implementing Update (3) of STEP 232, as will be appreciated by those skilled in the art.

The flow diagrams depicted herein are just exemplary. There may be many variations to these diagrams or the steps (or operations) described therein without departing from the spirit of the invention. For instance, the steps may be performed in a differing order, or steps may be added, deleted or modified. All these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method for determining an overall Chase decoding result for a series of Chase iterations for decoding input data, the method comprising the steps of:

performing a portion of an intermediate Chase iteration of the series of Chase iterations to obtain a successful hard-decision decoding result for the input data;

determining that the successful hard-decision decoding result comprises the overall Chase decoding result with employment of reliability information for at least one location of the input data and without employment of information that specifies, for the input data, error location within the input data; and wherein the step of performing a portion of the intermediate Chase iteration of the series of Chase iterations to obtain the successful hard-decision decoding result for the input data comprises the step of selecting the intermediate Chase iteration and a Chase iteration of the series of Chase iterations to comprise consecutive Chase iterations, having only one value difference between respective code patterns thereof, of the series of Chase iterations.

2. The method of claim 1 wherein the intermediate Chase iteration comprises a second intermediate Chase iteration of the series of Chase iterations, and herein the step of performing a portion of the second intermediate Chase iteration of the series of Chase iterations to obtain the successful hard-decision decoding result for the input data comprises the step of skipping at least one first intermediate Chase iteration of the series of Chase iterations to proceed to the second intermediate Chase iteration.

3. A system for determining an overall Chase decoding result for a series of Chase iterations for decoding input data, the system comprising:

a decoder that performs a portion of an intermediate Chase iteration of the series of Chase iterations to obtain a successful hard-decision decoding result for the input data;

wherein the decoder determines that the successful hard-decision decoding result comprises the overall Chase decoding result with employment of reliability information for at least one location of the input data and without employment of information that specifies, for the input data, error location within the input data; and wherein the intermediate Chase iteration and a Chase iteration of the series of Chase iterations comprise consecutive Chase iterations, having only one value difference between respective code patterns thereof, of the series of Chase iterations.

4. The system of claim 3 wherein the intermediate Chase iteration comprises a second intermediate Chase iteration of the series of Chase iterations, and wherein the decoder skips at least one first intermediate Chase iteration of the series of Chase iterations to proceed to the second intermediate Chase iteration.

5. An article of manufacture, comprising:

at least one computer usable medium having computer readable program code means embodied therein for causing determination of an overall Chase decoding result for a series of Chase iterations for decoding input data, the computer readable program code means in the article of manufacture comprising:

computer readable program code means for causing a computer to perform a portion of an intermediate Chase iteration of the series of Chase iterations to obtain a successful hard-decision decoding result for the input data; and computer readable program code means for causing a computer to determine that the successful hard-decision decoding result comprises the overall Chase decoding result with employment of reliability information for at least one location of the input data and without employment of information that specifies, for the input data, error location within the input data.

6. The article of manufacture of claim 5 wherein the computer readable program code means for causing a computer to perform a portion of the intermediate Chase iteration of the series of Chase iterations to obtain the successful hard-decision decoding result for the input data comprises means for causing a computer to select the intermediate Chase iteration and a Chase iteration of the series of Chase iterations to comprise consecutive Chase iterations, having only one value difference between respective code patterns thereof, of the series of Chase iterations.

7. The article of manufacture of claim 5 wherein the intermediate Chase iteration comprises a second intermediate Chase iteration of the series of Chase iterations, and wherein the computer readable program code means for causing a computer to perform a portion of the second intermediate Chase iteration of the series of Chase iterations to obtain the successful hard-decision decoding result for the input data comprises means for causing a computer to skip at least one first intermediate Chase iteration of the series of Chase iterations to proceed to the second intermediate Chase iteration.

8. A method for performing a plurality of Chase iterations of a series of Chase iterations for decoding input data, the method comprising the steps of:

employing a first code pattern to perform a first Chase iteration of the plurality of Chase iterations; and employing a second code pattern to perform a second Chase iteration of the plurality of Chase iterations;

wherein the first and second Chase iterations comprise consecutive Chase iterations of the series of Chase iterations;

wherein only one value difference exists between the first and second code patterns.

9. The method of claim 8 wherein the step of employing the second code pattern to perform the second Chase iteration of the plurality of Chase iterations comprises the steps of:

selecting the second Chase iteration to comprise an intermediate Chase iteration of the series of Chase iterations;

performing a portion of the second Chase iteration to obtain a successful hard-decision decoding result for the input data; and determining that the successful hard-decision decoding result comprises an overall Chase decoding result for the series of Chase iterations.

10. The method of claim 8 wherein the plurality of chase iterations occurs within a soft-output Chase decoder that serves to decode constituent block codes of a block turbo code.

11. A system for performing a plurality of Chase iterations of a series of Chase iterations for decoding input data, the system comprising:

a decoder that employs a first code pattern to perform a first Chase iteration of the plurality of Chase iterations;

wherein the decoder employs a second code pattern to perform a second Chase iteration of the plurality of Chase iterations;

wherein the first and second Chase iterations comprise consecutive Chase iterations of the series of Chase iterations;

wherein only one value difference exists between the first and second code patterns.

12. The system of claim 11 wherein the second Chase iteration comprises an intermediate Chase iteration of the series of Chase iterations, wherein the decoder performs a portion of the second Chase iteration to obtain a successful hard-decision decoding result for the input data, and wherein the decoder determines that the successful hard-decision decoding result comprises an overall Chase decoding result for the series of Chase iterations.

13. The system of claim 11 wherein the decoder skips at least one intermediate Chase iteration of the series of Chase iterations to proceed to the second Chase iteration.

14. An article of manufacture, comprising:
   at least one computer usable medium having computer readable program code means embodied therein for causing performance of a plurality of Chase iterations of a series of Chase iterations for decoding input data, the computer readable program code means in the article of manufacture comprising:
      computer readable program code means for causing a computer to employ a first code pattern to perform a first Chase iteration of the plurality of Chase iterations; and
      computer readable program code means for causing a computer to employ a second code pattern to perform a second Chase iteration of the plurality of Chase iterations;
   wherein the first and second Chase iterations comprise consecutive Chase iterations of the series of Chase iterations;
   wherein only one value difference exists between the first and second code patterns.

15. The article of manufacture of claim 14 wherein the computer readable program code means for causing a computer to employ the second code pattern to perform the second Chase iteration of the plurality of Chase iterations comprises:
   computer readable program code means for causing a computer to select the second Chase iteration to comprise an intermediate Chase iteration of the series of Chase iterations;
   computer readable program code means for causing a computer to perform a portion of the second Chase iteration to obtain a successful hard-decision decoding result for the input data; and
   computer readable program code means for causing a computer to determine that the successful hard-decision decoding result comprises an overall Chase decoding result for the series of Chase iterations.

16. The article of manufacture of claim 14 wherein the computer readable program code means for causing a computer to employ the second code pattern to perform the second Chase iteration of the plurality of Chase iterations comprises computer readable program code means for causing a computer to skip at least one intermediate Chase iteration of the series of Chase iterations to proceed to the second Chase iteration.

17. A method for processing a plurality of Chase iterations of a series of Chase iterations for decoding input data, the method comprising the steps of:
   performing a first Chase iteration of the series of Chase iterations to obtain a successful hard-decision decoding result for the input data; and
   skipping at least one intermediate Chase iteration of the series of Chase iterations to proceed to a second Chase iteration of the series of Chase iterations;
   wherein the first Chase iteration and a Chase iteration of the at least one intermediate Chase iteration comprise consecutive Chase iterations, having only one value difference between respective code patterns thereof, of the series of Chase iterations;
   wherein a Chase iteration of the at least one intermediate Chase iteration and the second Chase iteration comprise consecutive Chase iterations, having only one value difference between respective code patterns thereof, of the series of Chase iterations.

18. The method of claim 17 wherein the step of skipping the at least one intermediate Chase iteration of the series of Chase iterations to proceed to the second Chase iteration of the series of Chase iterations comprises the step of selecting the second Chase iteration to comprise an intermediate Chase iteration of the series of Chase iterations.

19. The method of claim 17 wherein the step of performing the first Chase iteration of the series of Chase iterations to obtain the successful hard-decision decoding result for the input data and the step of skipping the at least one intermediate Chase iteration of the series of Chase iterations to proceed to the second Chase iteration of the series of Chase iterations comprise the steps of:
   selecting the first Chase iteration and a selected Chase iteration of the at least one intermediate Chase iteration to comprise consecutive Chase iterations, having only one value difference between respective code patterns thereof, of the series of Chase iterations; and
   selecting the selected Chase iteration and the second Chase iteration to comprise consecutive Chase iterations, having only one value difference between respective code patterns thereof, of the series of Chase iterations.

20. The method of claim 17 wherein the step of skipping the at least one intermediate Chase iteration of the series of Chase iterations to proceed to the second Chase iteration of the series of Chase iterations comprises the step of selecting each set of consecutive Chase iterations, of the at least one intermediate Chase iteration, to comprise consecutive Chase iterations having only one value difference between respective code patterns thereof.

21. The method of claim 17 wherein the step of skipping the at least one intermediate Chase iteration of the series of Chase iterations to proceed to the second Chase iteration of the series of Chase iterations comprises the step of selecting the at least one intermediate Chase iteration to comprise a plurality of intermediate Chase iterations of the series of Chase iterations.

22. The method of claim 17 wherein the step of skipping the at least one intermediate Chase iteration of the series of Chase iterations to proceed to the second Chase iteration of the series of Chase iterations comprises the steps of:
   selecting the second Chase iteration to comprise an intermediate Chase iteration of the series of Chase iterations;
   performing a portion of the second Chase iteration to obtain a second successful hard-decision decoding result for the input data; and
   determining that the second successful hard-decision decoding result comprises an overall Chase decoding result for the series of Chase iterations.

23. A system for processing a plurality of Chase iterations of a series of Chase iterations for decoding input data, the system comprising:
   a decoder that performs a first Chase iteration of the series of Chase iterations to obtain a successful hard-decision decoding result for the input data;
   wherein the decoder skips at least one intermediate Chase iteration of the series of Chase iterations to proceed to a second Chase iteration of the series of Chase iterations;
   wherein the first Chase iteration and a Chase iteration of the at least one intermediate Chase iteration comprise consecutive Chase iterations, having only one value difference between respective code patterns thereof, of the series of Chase iterations;

wherein a Chase iteration of the at least one intermediate Chase iteration and the second Chase iteration comprise consecutive Chase iterations, having only one value difference between respective code patterns thereof, of the series of Chase iterations.

24. The system of claim 23 wherein the second Chase iteration comprises an intermediate Chase iteration of the series of Chase iterations.

25. The system of claim 23 wherein the first Chase iteration and a selected Chase iteration of the at least one intermediate Chase iteration comprise consecutive Chase iterations, having only one value difference between respective code patterns thereof, of the series of Chase iterations; and wherein the selected Chase iteration and the second Chase iteration comprise consecutive Chase iterations, having only one value difference between respective code patterns thereof, of the series of Chase iterations.

26. The system of claim 23 wherein each set of consecutive Chase iterations, of the at least one intermediate Chase iteration, comprises consecutive Chase iterations having only one value difference between respective code patterns thereof.

27. The system of claim 23 wherein the at least one intermediate Chase iteration comprises a plurality of intermediate Chase iterations of the series of Chase iterations.

28. The system of claim 23 wherein the second Chase iteration comprises an intermediate Chase iteration of the series of Chase iterations;

wherein the decoder performs a portion of the second Chase iteration to obtain a second successful hard-decision decoding result for the input data; and wherein the decoder determines that the second successful hard-decision decoding result comprises an overall Chase decoding result for the series of Chase iterations.

29. An article of manufacture, comprising:

at least one computer usable medium having computer readable program code means embodied therein for causing processing of a plurality of Chase iterations of a series of Chase iterations for decoding input data, the computer readable program code means in the article of manufacture comprising:

computer readable program code means for causing a computer to perform a first Chase iteration of the series of Chase iterations to obtain a successful hard-decision decoding result for the input data; and computer readable program code means for causing a computer to skip at least one intermediate Chase iteration of the series of Chase iterations to proceed to a second Chase iteration of the series of Chase iterations;

wherein the first Chase iteration and a Chase iteration of the at least one intermediate Chase iteration comprise consecutive Chase iterations, having only one value difference between respective code patterns thereof, of the series of Chase iterations;

wherein a Chase iteration of the at least one intermediate Chase iteration and the second Chase iteration comprise consecutive Chase iterations, having only one value difference between respective code patterns thereof, of the series of Chase iterations.

30. The article of manufacture of claim 29 wherein the computer readable program code means for causing a computer to skip the at least one intermediate Chase iteration of the series of Chase iterations to proceed to the second Chase iteration of the series of Chase iterations comprises computer readable program code means for causing a computer to select the second Chase iteration to comprise an intermediate Chase iteration of the series of Chase iterations.

31. The article of manufacture of claim 29 wherein the computer readable program code means for causing a computer to perform the first Chase iteration of the series of Chase iterations to obtain the successful hard-decision decoding result for the input data and the computer readable program code means for causing a computer to skip the at least one intermediate Chase iteration of the series of Chase iterations to proceed to the second Chase iteration of the series of Chase iterations comprise:

computer readable program code means for causing a computer to select the first Chase iteration and a selected Chase iteration of the at least one intermediate Chase iteration to comprise consecutive Chase iterations, having only one value difference between respective code patterns thereof, of the series of Chase iterations; and computer readable program code means for causing a computer to select the selected Chase iteration and the second Chase iteration to comprise consecutive Chase iterations, having only one value difference between respective code patterns thereof, of the series of Chase iterations.

32. The article of manufacture of claim 29 wherein the computer readable program code means for causing a computer to skip the at least one intermediate Chase iteration of the series of Chase iterations to proceed to the second Chase iteration of the series of Chase iterations comprises computer readable program code means for causing a computer to select each set of consecutive Chase iterations, of the at least one intermediate Chase iteration, to comprise consecutive Chase iterations having only one value difference between respective code patterns thereof.

33. The article of manufacture of claim 29 wherein the computer readable program code means for causing a computer to skip the at least one intermediate Chase iteration of the series of Chase iterations to proceed to the second Chase iteration of the series of Chase iterations comprises computer readable program code means for causing a computer to select the at least one intermediate Chase iteration to comprise a plurality of intermediate Chase iterations of the series of Chase iterations.

34. The article of manufacture of claim 31 wherein the computer readable program code means for causing a computer to skip the at least one intermediate Chase iteration of the series of Chase iterations to proceed to the second Chase iteration of the series of Chase iterations comprises:

computer readable program code means for causing a computer to select the second Chase iteration to comprise an intermediate Chase iteration of the series of Chase iterations;

computer readable program code means for causing a computer to perform a portion of the second Chase iteration to obtain a second successful hard-decision decoding result for the input data; and computer readable program code means for causing a computer to determine that the second successful hard-decision decoding result comprises an overall Chase decoding result for the series of Chase iterations.

* * * * *